United States Patent
Chae et al.

(10) Patent No.: US 8,216,889 B2
(45) Date of Patent: *Jul. 10, 2012

(54) THIN FILM TRANSISTOR AND METHOD OF FABRICATING THE SAME

(75) Inventors: Gee-Sung Chae, Incheon (KR); Mi-Kyung Park, Annyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/240,391

(22) Filed: Sep. 22, 2011

(65) Prior Publication Data
US 2012/0009707 A1    Jan. 12, 2012

Related U.S. Application Data

(62) Division of application No. 12/630,164, filed on Dec. 3, 2009, now Pat. No. 8,044,391, which is a division of application No. 11/397,746, filed on Apr. 4, 2006, now Pat. No. 7,645,647.

(30) Foreign Application Priority Data

Apr. 7, 2005  (KR) .................. 10-2005-0029121

(51) Int. Cl.
*H01L 21/00* (2006.01)
(52) U.S. Cl. ......... 438/149; 438/775; 438/776; 257/59; 257/E21.413; 977/742; 977/762
(58) Field of Classification Search ............ 438/149, 438/775, 776; 257/59, E21.413; 977/742, 977/762
See application file for complete search history.

(56) References Cited

U.S. PATENT DOCUMENTS

| 6,969,872 | B2 | 11/2005 | Kim |
| 7,067,867 | B2 | 6/2006 | Duan et al. |
| 7,439,562 | B2 | 10/2008 | Auvray et al. |
| 2005/0056826 | A1 | 3/2005 | Appenzeller et al. |
| 2006/0008942 | A1* | 1/2006 | Romano et al. .......... 438/99 |

FOREIGN PATENT DOCUMENTS

| CN | 1300105 A | 6/2001 |
| JP | 2003-017508 | 1/2003 |
| JP | 2006-032906 | 2/2006 |
| KR | 1020000029160 A | 5/2000 |
| KR | 1020040065339 A | 7/2004 |
| KR | 1020050001193 A | 1/2005 |

OTHER PUBLICATIONS

Yu, D.P. et al., "Nanoscale Silicon Wires Synthesized Using Simple Physical Evaporation" Applied Physics Letters, vol. 72 No. 26, 3458-3460. First Notification of Office Action issued in corresponding Chinese Patent Application No. 200610072572.6; issued Mar. 7, 2008.
Office Action issued in corresponding Japanese Patent Application No. 2006-104958; mailed May 10, 2010.
Office Action issued in corresponding Korean Patent Application No. 10-2005-0029121, mailed Jun. 17, 2011.

* cited by examiner

*Primary Examiner* — Andy Huynh
(74) *Attorney, Agent, or Firm* — Brinks Hofer Gilson & Lione (57) ABSTRACT

A thin film transistor includes a multi-coaxial silicon nanowire unit including a plurality of coaxial silicon nanowires on a substrate, the multi-coaxial silicon nanowire unit including a central portion and end portions of the central portion; a gate electrode on the central portion; and a source electrode and a drain electrode on the respective end portions, respectively, so as to electrically connect to the multi-coaxial silicon nanowire unit.

5 Claims, 10 Drawing Sheets

FIG. 1

(related art)

FIG. 2

(related art)

THIN FILM TRANSISTOR AND METHOD OF FABRICATING THE SAME

The present patent document is a divisional of U.S. patent application Ser. No. 12/630,164, filed Dec. 3, 2009, which is a divisional of U.S. patent application Ser. No. 11/397,746, filed Apr. 4, 2006, which claims priority to Korean Patent Application No. 2005-0029121 filed in Korea on Apr. 7, 2005, which is hereby incorporated by reference.

BACKGROUND

1. Field of the Invention

The present invention relates to a flat panel display (FPD), and more particularly to a thin film transistor (TFT) for a FPD and a manufacturing method thereof.

2. Discussion of the Related Art

Generally, the FPD includes a liquid crystal display (LCD) device, a plasma display panel (PDP) and an organic electroluminescent display device (OLED) or the like. Here, the TFT is utilized as a switching element or a driving element of the FPD.

Figure 1:
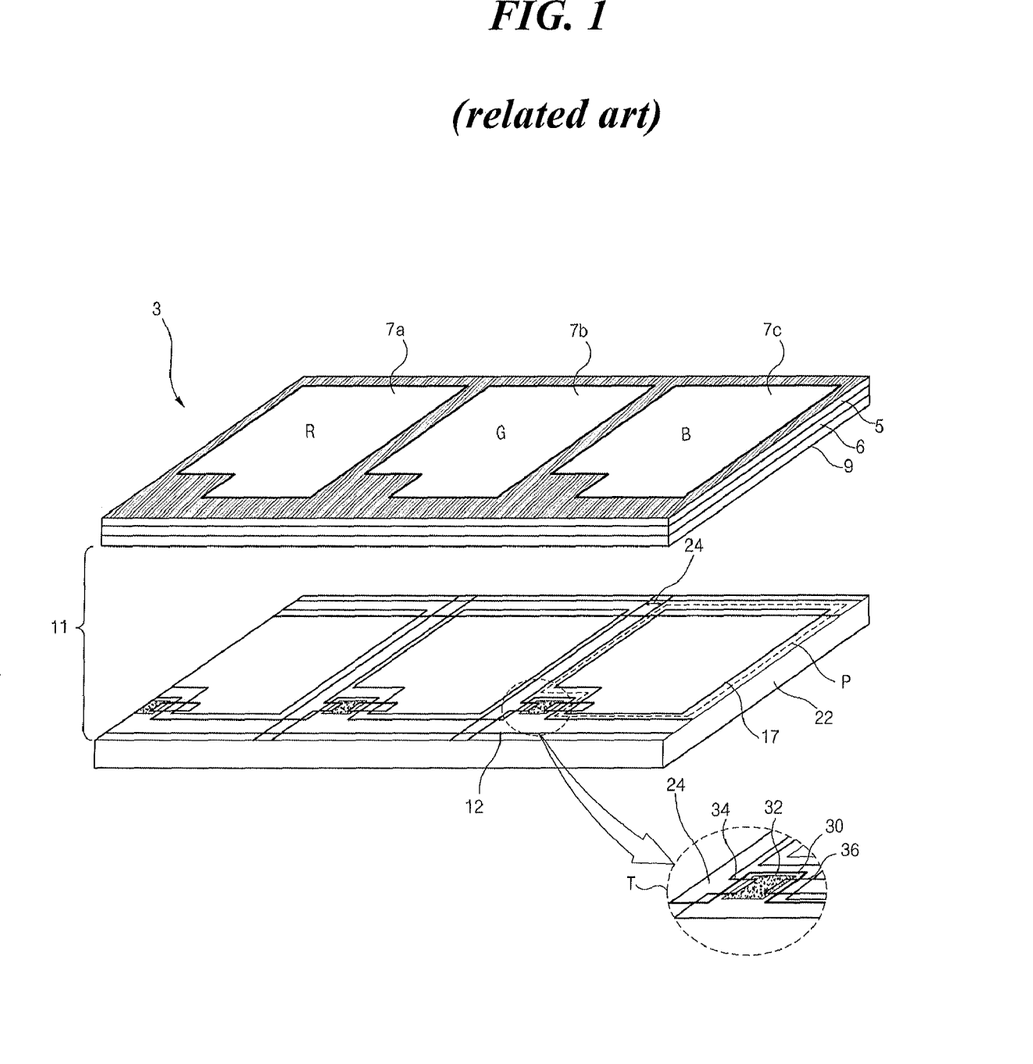
FIG. 1 is a schematic view of a structure of an LCD according to the related art.

FIG. 1 is a schematic view of a structure of an LCD according to the related art.

In FIG. 1, an LCD 3 includes upper and lower substrates 5 and 22 facing each other and a liquid crystal layer 11 between the upper and lower substrates 5 and 22.

A gate line 12 and a data line 24 crossing the gate line 12 are formed on the lower substrate 22 to define a pixel region P. A TFT T is disposed at a position adjacent to the crossing of the gate line 12 and the data line 24, and a pixel electrode 17 is connected to the TFT T and is disposed in the pixel region P. The pixel electrode 17 includes a transparent conductive material such as, for example, indium tin oxide (ITO) or indium zinc oxide (IZO).

The TFT T includes a gate electrode 30 connected to the gate line 12, a source electrode 34 connected to the data line 24, a drain electrode 36 spaced apart from the source electrode 34, and a semiconductor layer 32 between the gate electrode 30 and the source electrode 34 and between the gate electrode 30 and the drain electrode 36.

Here, the gate line 12 provides a scanning signal from a first external circuit with the gate electrode 30 and the data line 24 provides a data signal from a second external circuit with the source electrode 34.

Further, red, green and blue sub-color filters 7a, 7b and 7c are formed on the upper substrate 5, wherein each of the red, green and blue sub-color filters 7a, 7b and 7c is repeatedly disposed in a region corresponding to the pixel region P. A black matrix 6 is formed in an intervening space between the red, green and blue sub-color filters 7a, 7b and 7c and a common electrode 9 is formed on the red, green and blue sub-color filters 7a, 7b and 7c and the black matrix 6.

Liquid crystal molecules of the liquid crystal layer 11 have an anisotropic dielectric constant and anisotropic refractive index characteristics due to their long, thin shape. In addition, two electric field generating electrodes are formed on the two substrates, respectively. Accordingly, the orientation of the liquid crystal molecules can be controlled by supplying a voltage to the two electrodes. Transmittance of the LCD panel is thus changed according to the polarization properties of the liquid crystal material.

The TFT may have various configurations. Typically, an inverted staggered type TFT of amorphous silicon or a top gate type TFT of polysilicon are utilized.

Figure 2:
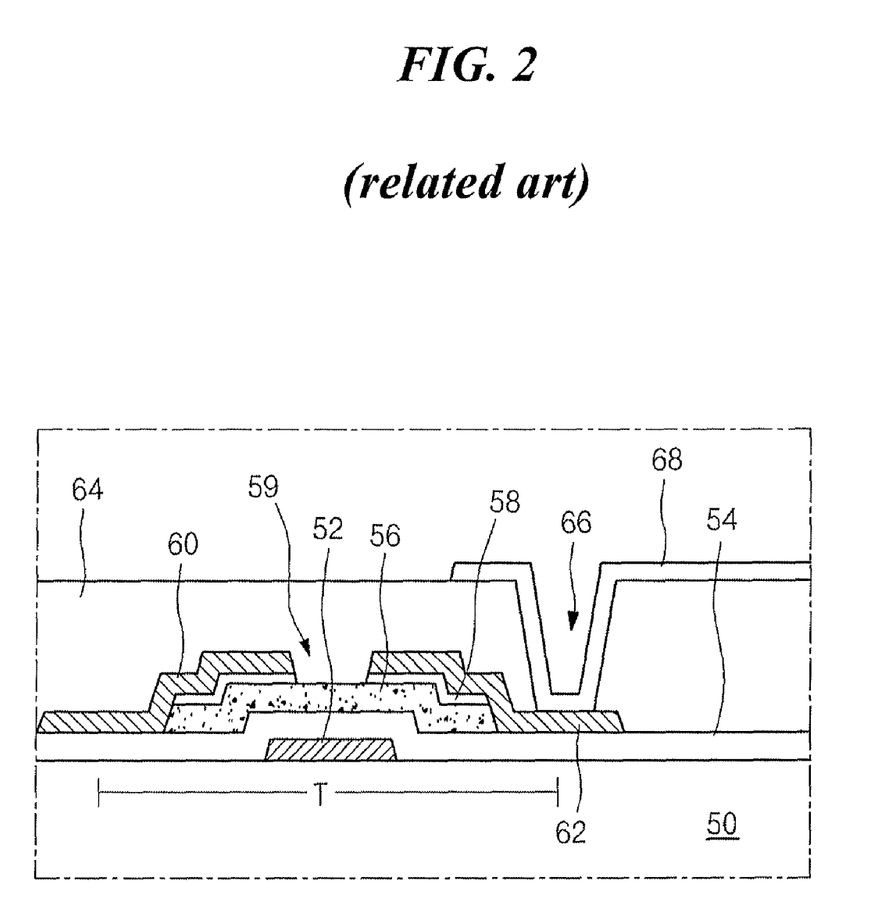
FIG. 2 is a schematic cross-sectional view of an inverted staggered type TFT according to the related art.

FIG. 2 is a schematic cross-sectional view of an inverted staggered type TFT according to the related art.

In FIG. 2, an inverted staggered type TFT T includes a gate electrode 52 on a substrate 50, a gate insulating layer 54 on an entire surface of the substrate 50 having the gate electrode 52, an active layer 56 on the gate insulating layer 54 over the gate electrode 52, and an ohmic contact layer 58 on the active layer 56. Here, the ohmic contact layer 58 has an opening portion 59 that exposes a central portion of the active layer 56. Source and drain electrodes 60 and 62 are formed on the ohmic contact layer 58. The source and drain electrodes 60 and 62 are spaced apart from each other by the opening portion 59. Substantially, the opening portion 59 defines a channel portion (not shown) of the TFT T.

Further, a passivation layer 64 is formed on the TFT T. The passivation layer 64 has a drain contact hole 66 that exposes a portion of the drain electrode 62. The pixel electrode 68 is formed on the passivation layer 64 and is connected to the drain electrode 62 via the drain contact hole 66.

FIGS. 3A to 3E are schematic cross-sectional views showing an array substrate including an inverted staggered TFT in accordance with a manufacturing process thereof of the related art.

Figure 3A:
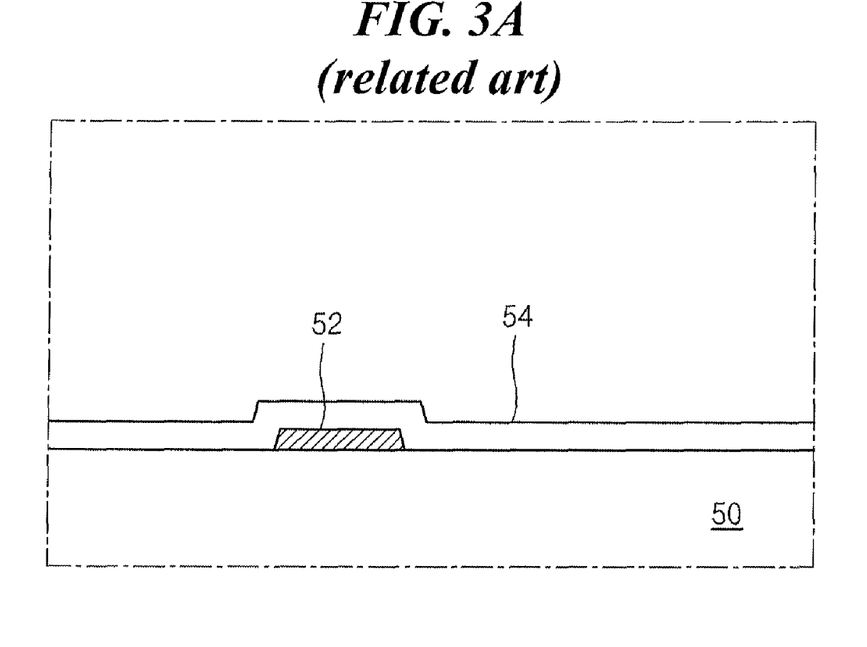
FIGS. 3A to 3E are schematic cross-sectional views showing an array substrate including an inverted staggered TFT in accordance with a manufacturing process thereof of the related art.

In FIG. 3A, a gate electrode 52 is formed by depositing and patterning a conductive material such as aluminum (Al), Al alloy, copper, tungsten (W), or molybdenum (Mo) on a substrate 50.

Next, a gate insulating layer 54 is formed by depositing an inorganic insulating material, such as silicon nitride or silicon oxide, on the substrate 50 where the gate electrode 52 is formed.

Figure 3B:
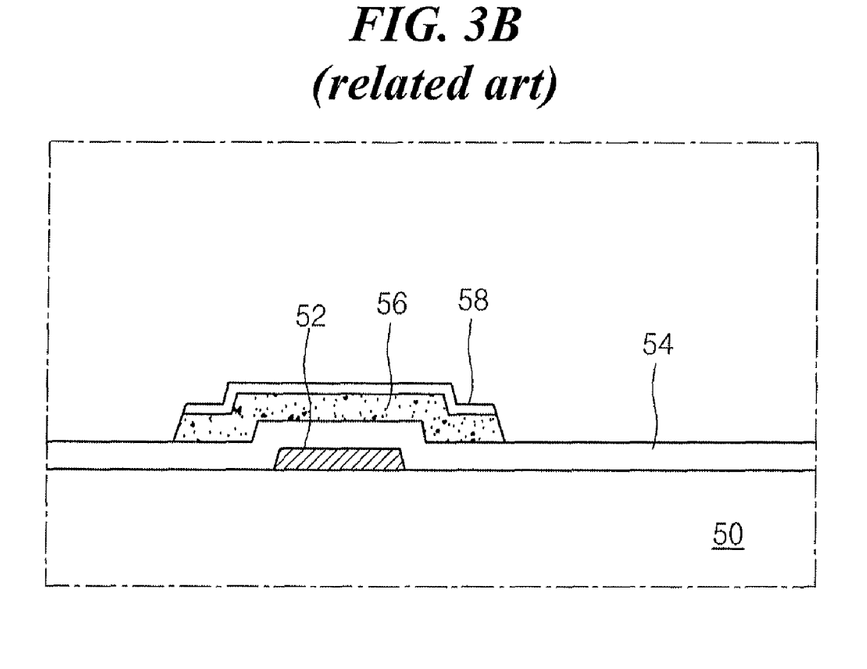

In FIG. 3B, amorphous silicon and doped amorphous silicon are deposited on the gate insulating layer 54 and patterned into an active layer 56 and an ohmic contact layer 58, respectively. For example, the amorphous silicon is deposited by a plasma enhanced chemical vapor deposition (PECVD) after decomposing a silane gas ($SiH_4$) by radio frequency (RF) power. Forming the doped amorphous silicon includes preparing a chamber (not shown) where the substrate 50 having the amorphous silicon formed thereon is disposed and injecting a doping gas such as silane ($SiH_4$), a dilution gas of hydrogen, phosphine ($PH_3$) and diborane ($B_2H_6$), into the chamber. Here, when the gas pressure reaches a predetermined level, impurities such as phosphorous (P) or boron (B) may be incorporated as dopants into the amorphous silicon by providing RF power in the chamber.

The active layer 56 and the ohmic contact layer 58 can be formed having predetermined patterns by performing a mask process for patterning the amorphous silicon layer and the doped amorphous silicon layer.

Figure 3C:
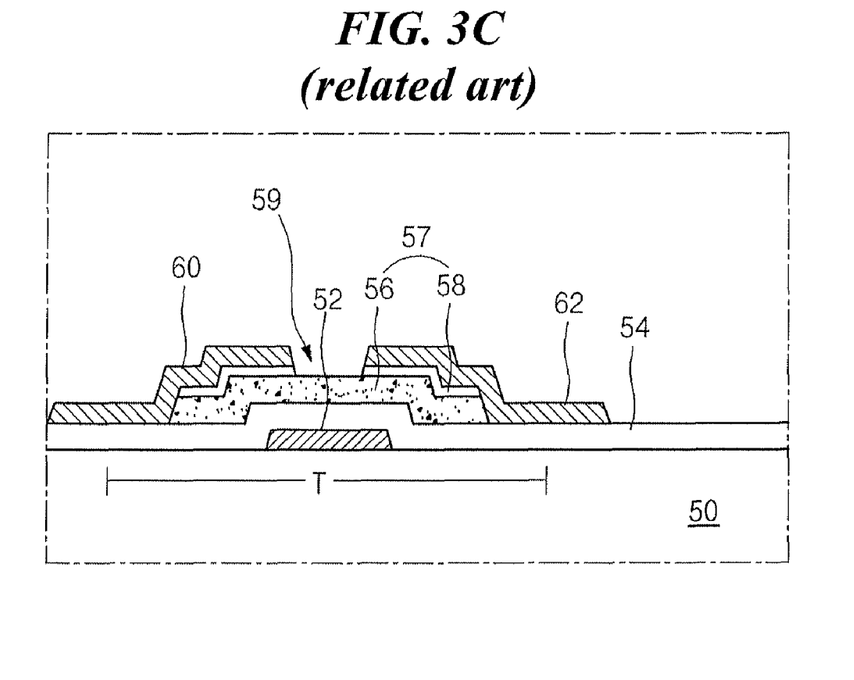

FIG. 3C, source and drain electrodes 60 and 62 are formed by depositing and patterning a conductive material, such as the same material as the gate electrode material, on the ohmic contact layer 58. Here, the source and drain electrodes 60 and 62 are spaced apart from each other by an opening portion 59 that exposes a portion of the ohmic contact layer 58.

Sequentially, a portion of the ohmic contact layer 58 corresponding to the opening portion 59 is removed and a portion of the active layer 56 corresponding to the opening portion 59 is exposed. The exposed portion of the active layer 56 is defined as a channel region (not shown).

The active layer 56 and the ohmic contact layer 58 form a semiconductor layer 57.

Using the above-described process, a TFT T including the gate electrode 52, the semiconductor layer 57, and source and drain electrodes 60 and 62 may be formed.

Figure 3D:
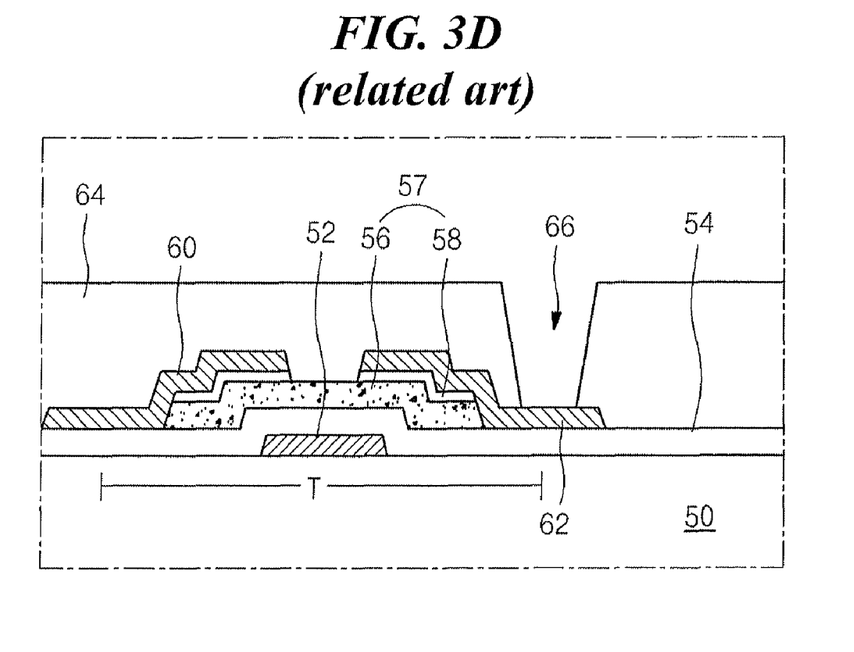

In FIG. 3D, a passivation layer 64 is formed by depositing an inorganic insulating material such as silicon nitride (SiNx) and silicon oxide (SiOx) or by coating an organic insulating layer such as benzocyclobutene (BCB) and acrylic resin on the substrate 50 where the source and drain electrodes 60 and 62 are formed.

Next, a drain contact hole 66 is formed by patterning the passivation layer 64. The drain contact hole 66 exposes a portion of the drain electrode 62.

Figure 3E:
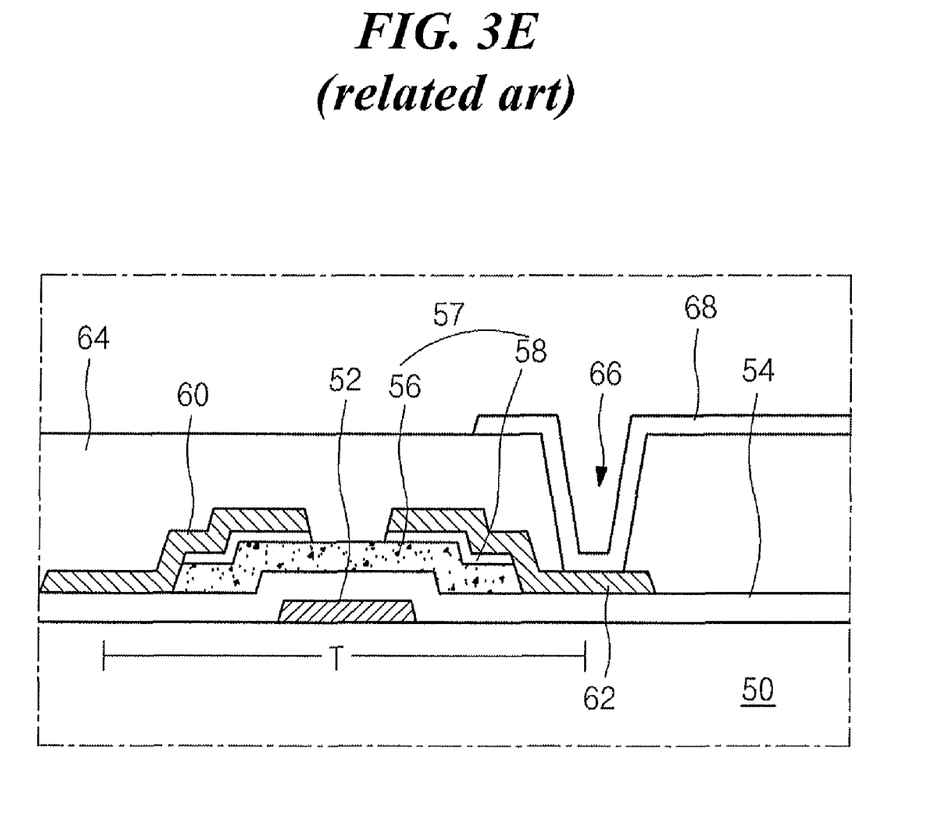

In FIG. 3E, a pixel electrode 68 is formed by depositing and patterning a transparent conductive material, such as indium tin oxide (ITO) or indium zinc oxide (IZO), on the passivation layer 64. Here, the pixel electrode 68 is connected to the drain electrode 62 via the drain contact hole 66.

Although the semiconductor layer 57 of the inverted staggered TFT T includes amorphous silicon, the amorphous silicon is unsuitable for a large size LCD. It is because the amorphous silicon has a low mobility regarding an electron and a hole thereof.

As one means to solve the problem, a top gate TFT using polysilicon having a higher mobility than the amorphous silicon has been suggested.

Figure 4:
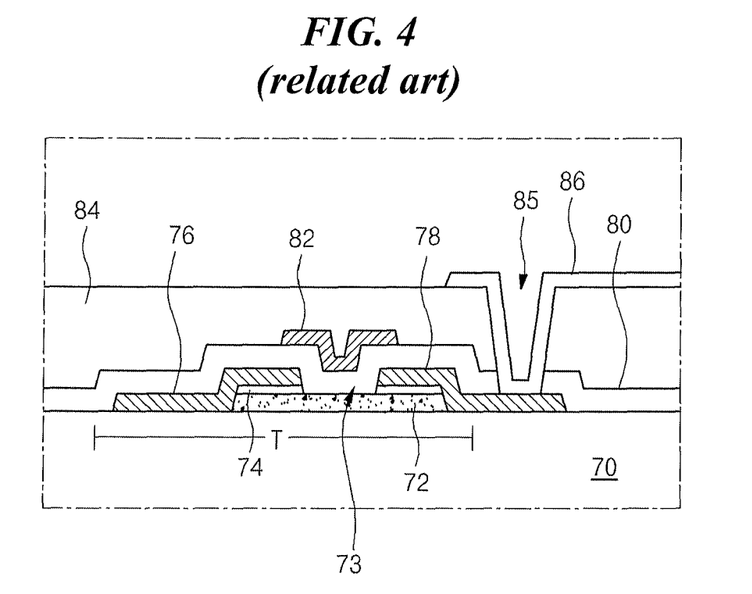
FIG. 4 is a schematic cross-sectional view of a top gate type TFT according to the related art.

FIG. 4 is a schematic cross-sectional view of a top gate type TFT according to the related art.

In FIG. 4, a top gate type TFT T includes an active layer 72 of polysilicon on a substrate 70, an ohmic contact layer 74 on the active layer 72 which has an opening portion 73 that exposes a central portion of the active layer 72, and source and drain electrodes 76 and 78 spaced apart from each other by the opening portion 73.

The opening portion 73 defines a channel region (not shown). A gate insulating layer 80 is formed on an entire surface of the substrate 70 where the active layer 72, the ohmic contact layer 74 and the opening portion 73 are formed. A gate electrode 82 is formed on the gate insulating layer 80 at a position corresponding to the opening portion 73. A passivation layer 84 is formed on the gate electrode 82 and has a drain contact hole 85 that exposes a portion of the drain electrode 78. A pixel electrode 86 is formed on the passivation layer 84 and is connected to the drain electrode 78 via the drain contact hole 85. For example, the active layer 72 is made of polysilicon formed by crystallizing amorphous silicon.

As explained above, the inverted staggered type or the top gate type TFT is manufactured through a complicated process for forming the active layer 72 and the ohmic contact layer 74. Furthermore, forming the array substrate includes forming the TFT T, and, for example, forming the TFT T is not independent from forming and the data line (not shown) applying signals to the source and drain electrodes 76 and 78 of the TFT T.

Therefore manufacturing the array substrate increases the process time and the production cost.

A TFT using a silicon nanowire has been suggested in order to solve this problem.

Figure 5:
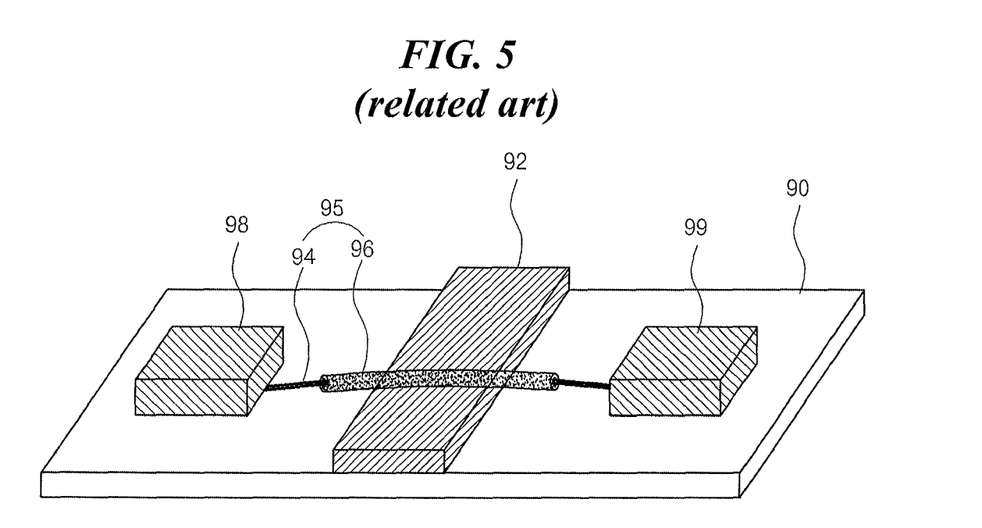
FIG. 5 is a schematic cross sectional view showing a structure of a TFT including a silicon nanowire according to the related art.

FIG. 5 is a schematic cross sectional view showing a structure of a TFT including a silicon nanowire according to the related art.

In FIG. 5, a gate electrode 92 is formed on a substrate 90, source and drain electrodes 98 and 99 are formed on both sides of the gate electrode 92, and a silicon nanowire 95 is disposed on the gate electrode 92 so as to directly contact the source and drain electrodes 98 and 99 through both sides thereof. Typically, forming the silicon nanowire 95 is performed before forming the source and drain electrodes 98 and 99.

To connect the silicon nanowire 95 and the source and drain electrodes 98 and 99, an insulating layer 96, such as an oxide layer of the silicon nanowire 95 surrounding a crystalline silicon 94 of the silicon nanowire 95, is removed at each end of the silicon nanowire 95 before forming the source and drain electrodes 98 and 99.

Accordingly, an additional process for connecting the silicon nanowire 95 and the source and drain electrodes 98 and 99 is required. Therefore, since the silicon nanowire 95 is unstably disposed on the gate electrode 92, an electric contact state between the semiconductor material, such as the silicon nanowire 95, and the metal layer, such as the source and drain electrodes 98 and 99, is unstable. Therefore, a number of variables may undesirably affect the operation of the device.

BRIEF SUMMARY

Described herein is a TFT including a multi-coaxial silicon nanowire unit having a plurality of coaxial silicon nanowires and a method of fabricating the same. Also described is a fabrication method that may permit a reduced process time and product cost.

Advantageously, the TFT including a multi-coaxial silicon nanowire unit may achieve stable operation. Further, a source electrode and drain electrode of the TFT are electrically connected to respective ends of the multi-coaxial silicon nanowire unit. The TFT may include a multi-coaxial silicon nanowire unit that does not affect process parameters since source and drain electrodes of the TFT can be formed of the same material through the same process as the gate electrode.

According to one embodiment, the thin film transistor includes a multi-coaxial silicon nanowire unit including a plurality of coaxial silicon nanowires on a substrate. The multi-coaxial silicon nanowire unit includes a central portion and end portions of the central portion. The thin film transistor also includes a gate electrode on the central portion, and a source electrode and a drain electrode on the respective end portions, so as to electrically connect to the multi-coaxial silicon nanowire unit.

According to another embodiment, an array substrate including a thin film transistor includes a multi-coaxial silicon nanowire unit including a plurality of coaxial silicon nanowires on a substrate. The multi-coaxial silicon nanowire unit includes a central portion and side portions of the central portion. The array substrate also includes a gate electrode on the central portion of the multi-coaxial silicon nanowire unit, and a first source electrode and a first drain electrode on the respective side portions so as to electrically connect to the multi-coaxial silicon nanowire unit. A second source electrode is connected to the first source electrode and a second drain electrode is connected to the first drain electrode. Also, a pixel electrode is connected to the second drain electrode.

According to one embodiment of a method of making a thin film transistor, a multi-coaxial silicon nanowire unit including a plurality of coaxial silicon nanowires is disposed on a substrate. The multi-coaxial silicon nanowire unit includes a central portion and side portions of the central portion. A gate electrode is formed on the central portion, and a source electrode and a drain electrode are formed on the respective side portions so as to electrically connect to the multi-coaxial silicon nanowire unit.

According to another embodiment of a method of making an array substrate including a thin film transistor, a multi-coaxial silicon nanowire unit including a plurality of coaxial silicon nanowires is disposed on a substrate. The multi-coaxial silicon nanowire unit includes a central portion and side portions of the central portion. A gate electrode is formed on the central portion, and a first source electrode and a first drain electrode are formed on the respective side portions so as to electrically connect to the multi-coaxial silicon nanowire unit. A second source electrode connected to the first source electrode and a second drain electrode connected to the first drain electrode are formed, and a pixel electrode connected to the second drain electrode is formed.

It is to be understood that both the foregoing general description and the following detailed description are exemplary and explanatory and are intended to provide further explanation of the invention as claimed.

DETAILED DESCRIPTION OF THE DRAWINGS AND THE PRESENTLY PREFERRED EMBODIMENTS

Reference will now be made in detail to various embodiments of the present disclosure, examples of which are illustrated in the accompanying drawings. Wherever possible, the same reference numbers will be used throughout the drawings to refer to the same or similar parts.

One embodiment relates to a TFT including a multi-coaxial silicon nanowire unit that consists of a plurality of coaxial silicon nanowires. Here, the coaxial silicon nanowires may be layered in parallel with each other.

Specifically, the coaxial silicon nanowire consists of a core of a semiconductor material and an insulating layer surrounding the core having a coaxial structure with the core.

Further, a source electrode and a drain electrode of the TFT are electrically connected to respective ends of the multi-coaxial silicon nanowire unit. The core is exposed from the insulating layer to facilitate electrical interconnection of the source and drain electrodes and the multi-coaxial silicon nanowire unit.

FIGS. 6A to 6F are schematic cross-sectional views showing an array substrate having a TFT in accordance with a manufacturing process according to one embodiment.

Figure 6A:
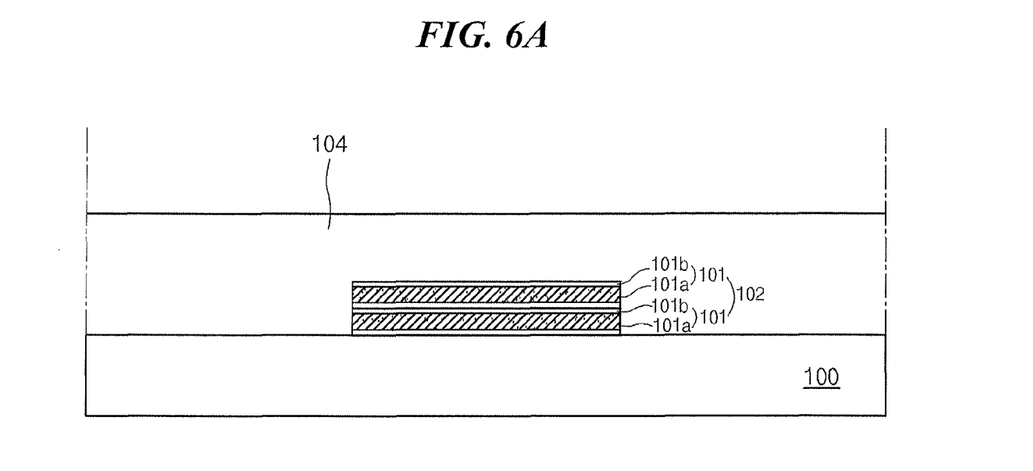
FIGS. 6A to 6F are schematic cross-sectional views showing an array substrate having a TFT in accordance with a manufacturing process according to one embodiment of the present disclosure.

In FIG. 6A, a multi-coaxial silicon nanowire unit 102 is disposed on a substrate 100. The multi-coaxial silicon nanowire unit 102 includes a plurality of coaxial silicon nanowires 101. Each of the plurality of coaxial silicon nanowires 101 consists of a core 101a of a semiconductor material and an insulating layer 101b surrounding the core 101a.

Although the multi-coaxial silicon nanowire unit 102 shown in FIG. 6A includes two coaxial silicon nanowires 101, the multi-coaxial silicon nanowire unit 102 may include more than two coaxial silicon nanowires 101. The multi-coaxial silicon nanowire unit 102 may be disposed on the substrate 100 by, for example, spraying.

Next, a fixing layer 104 may be formed on the substrate 100 where the multi-coaxial silicon nanowire unit 102 is formed so as to secure the multi-coaxial silicon nanowire unit 102 to the substrate 100. The fixing layer 104 may include, for example, an inorganic insulating material such as benzocyclobutene (BCB) and acrylic resin.

However, the fixing process may be omitted in some cases.

Figure 6B:
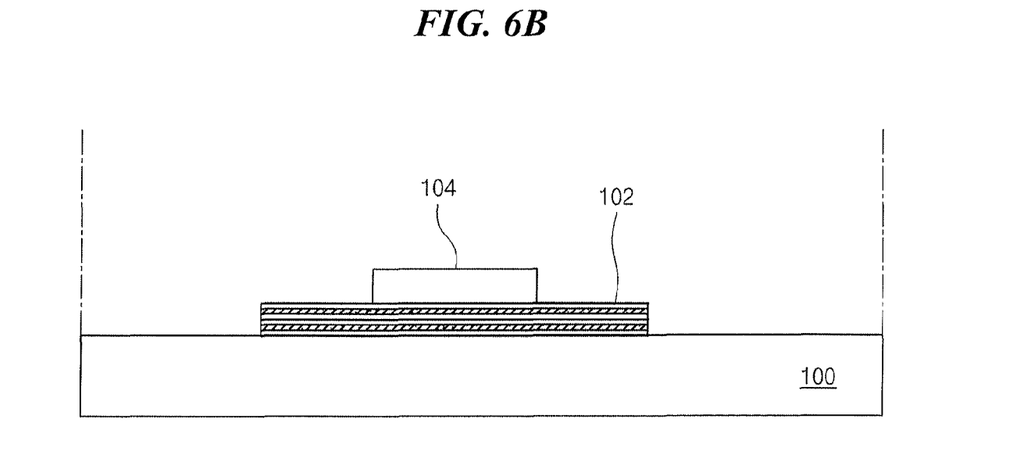

In FIG. 6B, the fixing layer 104 may be patterned so as to occupy a central portion of the multi-coaxial silicon nanowire unit 102. In other words, through the patterning process of the fixing layer 104, both end portions of the multi-coaxial silicon nanowire unit 102 are exposed through the fixing layer 104.

Although not shown in the figures, both ends of the insulating layer 101b may be removed to expose both ends of the core 101a of each of the coaxial silicon nanowires 101 during patterning of the fixing layer 104. Alternatively, removal of the insulating layer 101b may be performed before or after the fixing layer 104 is patterned.

Figure 6C:
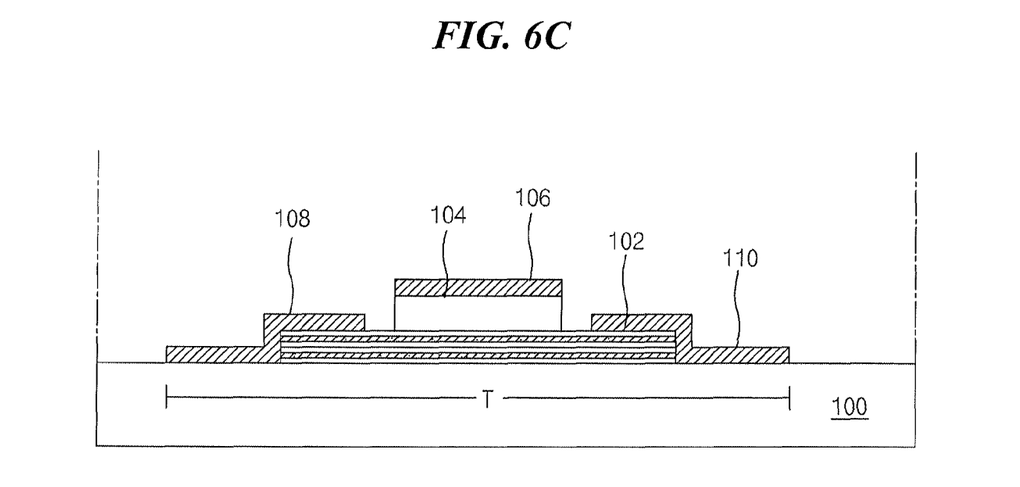

In FIG. 6C, a gate electrode 106 is formed on the central portion of the multi-coaxial silicon nanowire unit 102, and a first source electrode 108 and a first drain electrode 110 are formed on respective end portions of the multi-coaxial silicon nanowire unit 102.

In this process, the gate electrode 106, the first source electrode 108 and the first drain electrode 110 are formed by depositing and patterning a conductive metallic material such as aluminum (Al), Al alloy, copper, tungsten (W), molybdenum (Mo), titanium (Ti) or chromium (Cr). At this time, the gate electrode 106, the first source electrode 108 and the first drain electrode 110 are spaced apart from each other, and the first source electrode 108 and the first drain electrode 110 are electrically connected to the multi-coaxial silicon nanowire unit 102 at respective end portions. Substantially, the first source electrode 108 and the first drain electrode 110 are electrically connected to the exposed cores at respective end portions.

A silicide layer (not shown) is formed between the multi-coaxial silicon nanowire unit 102 and the first source electrode 108 and the multi-coaxial silicon nanowire unit 102 and the first drain electrode 110 so as to act as an ohmic contact layer. Therefore, an additional process to form an ohmic contact layer is unnecessary.

At this time, the multi-coaxial silicon nanowire unit 102, the gate electrode 106, the first source electrode 108 and the first drain electrode 110 constitute a TFT T.

Figure 6D:
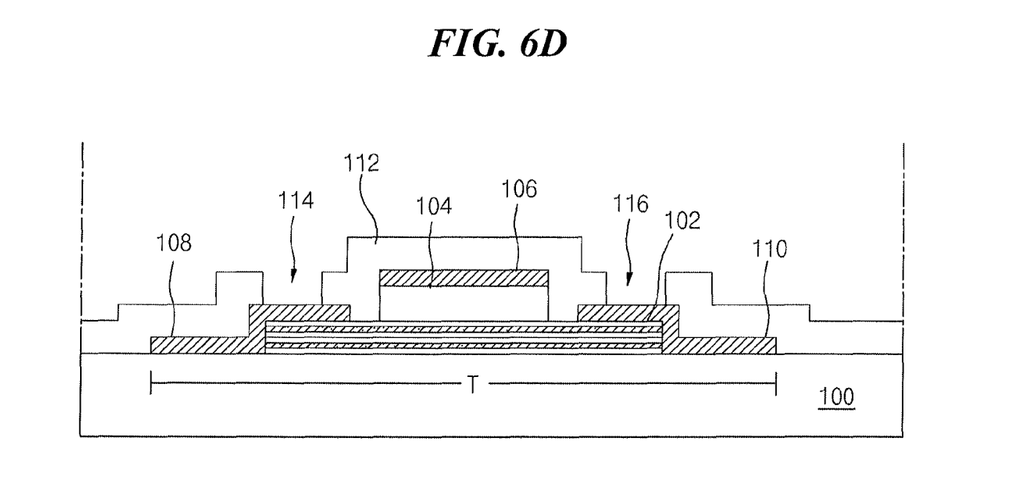

In FIG. 6D, a gate insulating layer 112 is formed by depositing and patterning an inorganic insulating material such as silicon nitride (SiNx) or silicon oxide (SiOx) on the substrate 100 where the first source electrode 108 and the first drain electrode 110 are formed. Consequently, the gate insulating layer 112 has first and second contact holes 114 and 116 that expose portions of the first source and the first drain electrodes 108 and 110, respectively.

Figure 6E:
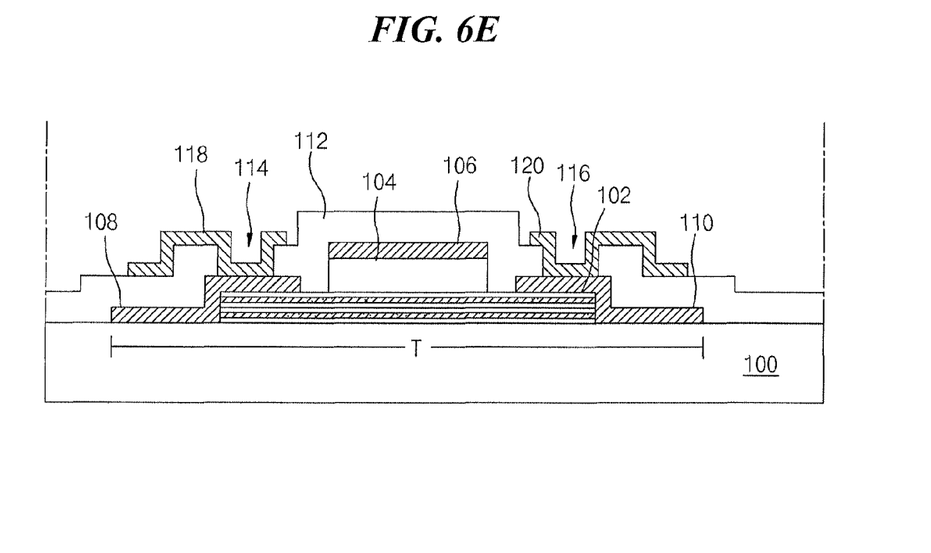

In FIG. 6E, a second source electrode 118 and a second drain electrode 120 are formed by depositing and patterning a conductive metallic material on the substrate 100 where the gate insulating layer 112 is formed. Here, the second source electrode 118 is connected to the first source electrode 108 via the first contact hole 114 and the second drain electrode 120 is connected to the first drain electrode 110 via the second contact hole 116.

Although not shown, a data line is connected to the second source electrode 118 in this process. Accordingly, data signals may be applied to the second source electrode 118 and the second drain electrode 120 by the data line. Therefore, the data signals are applied to the first source electrode 108 and the first drain electrode 110 by the connection of the first source and drain electrodes 108, 110 to the second source electrode 118 and the second drain electrode 120, respectively.

Figure 6F:
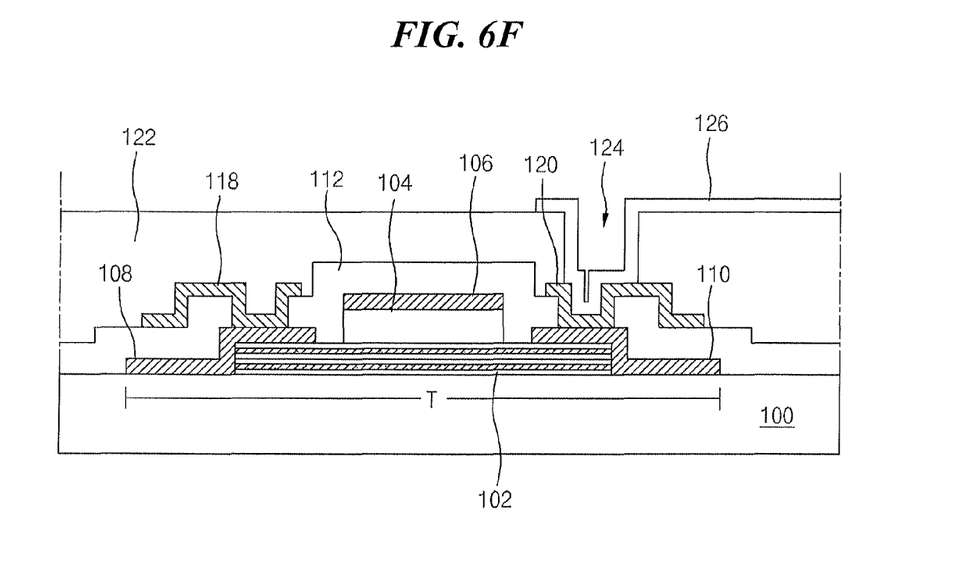

In FIG. 6F, a passivation layer 122 is formed by depositing an inorganic insulating material such as silicon nitride (SiNx) or silicon oxide (SiOx) or by coating an organic insulating material such as benzocyclobutene (BCB) or acrylic resin on the substrate 100 where the second source and the second drain electrodes 118 and 120 are formed. Here, the passivation layer 122 is patterned so as to have a drain contact hole 124 that exposes a portion of the second drain electrode 120.

Next, a pixel electrode 126 is formed by depositing and patterning a transparent conductive material such as indium tin oxide (ITO) or indium zinc oxide (IZO) on the passivation layer 122. Here, the pixel electrode 126 is connected to the second drain electrode 120 via the drain contact hole 124.

Hereinafter, a structure of the multi-coaxial silicon nanowire unit is explained in detail.

Figure 7:
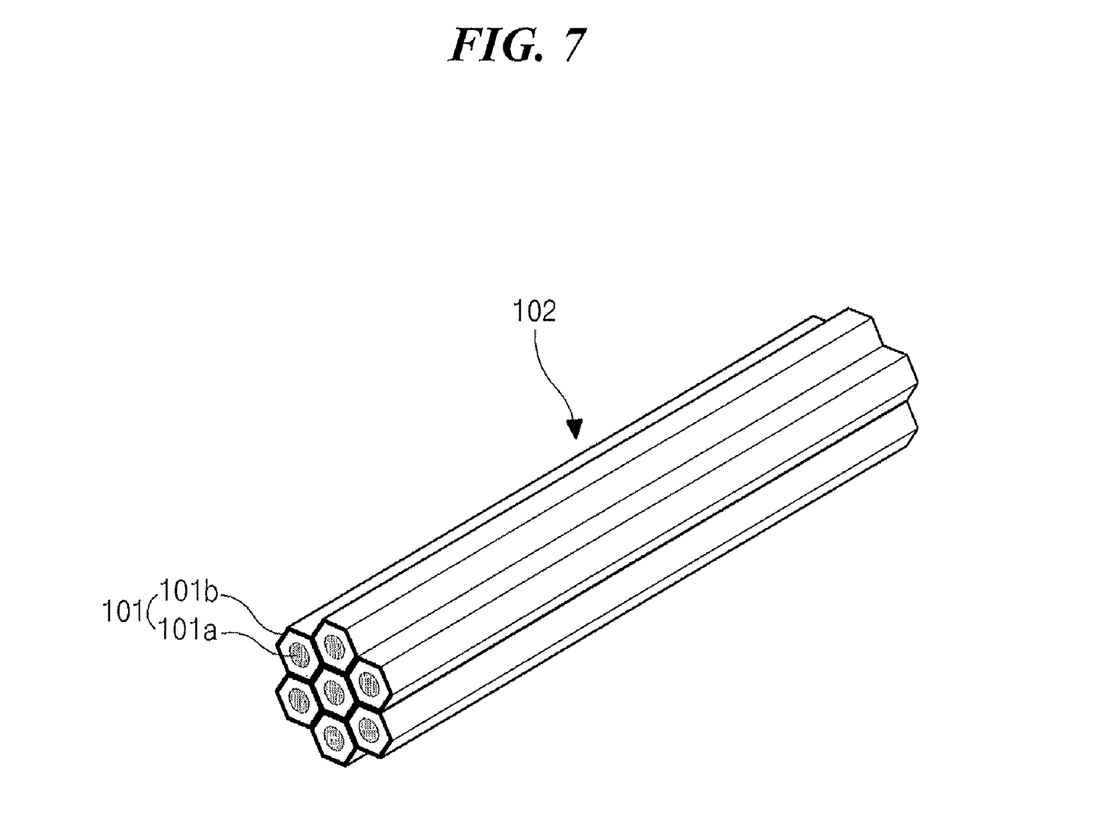
FIG. 7 is a schematic perspective view of a multi-coaxial silicon nanowire unit according to one embodiment of the present disclosure.

FIG. 7 is a schematic perspective view of a multi-coaxial silicon nanowire according to one embodiment.

In FIG. 7, a multi-coaxial silicon nanowire unit 102 includes a plurality of coaxial silicon nanowires 101. Each of the plurality of coaxial silicon nanowires 101 consists of a core 101a of a semiconductor material and an insulating layer 101b surrounding the core 101a.

Although not shown, the core 101a is formed by depositing a catalyst having a nanoscale size and crystallizing the catalyst using a reactive gas including silicon. The insulating layer 101b is formed by crystallizing one of silica and alumina. Accordingly, the semiconductor material includes crystalline silicon.

More particularly, the multi-coaxial silicon nanowire unit 102 may have exposed cores 101a at the ends so that the cores 101a may be electrically connected to the source electrode and the drain electrode by removing a portion of the insulating layer 101b.

The core 101a and the insulating layer 101b may have a coaxial structure and the coaxial silicon nanowire 101 may have a rod shape. Further, the insulating layer 101b has a tubular shape.

Accordingly, the TFT described herein utilizes the multi-coaxial nanowire unit having a plurality of coaxial nanowires. The coaxial nanowires include the core and the insulating layer surrounding the core as an active layer. An additional insulating layer may be omitted due to the insulating layer of the multi-coaxial nanowire unit. Further, the TFT may be manufactured as an independent element from the array elements since the first source electrode and the first drain electrode are formed of the same material through the same process as the gate electrode. Consequently, the processing time and the product cost of the TFT may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. A method of making a thin film transistor, comprising:
    disposing a multi-coaxial silicon nanowire unit including a plurality of coaxial silicon nanowires on a substrate, the multi-coaxial silicon nanowire unit including a central portion and end portions of the central portion;
    forming a fixing layer on the central portion of the multi-coaxial silicon nanowire unit and on the substrate;
    forming a gate electrode on the fixing layer;
    forming a first source electrode and a first drain electrode on the respective end portions so as to electrically connect to the multi-coaxial silicon nanowire unit, wherein the gate electrode, the first source electrode, and the first drain electrode are simultaneously formed in the same process step; and
    forming a second source electrode connected to and overlapping the first source electrode and a second drain electrode connected to and overlapping the first drain electrode.

2. The method according to claim 1, further comprising forming each of the plurality of coaxial silicon nanowires, including forming a core and forming an insulating layer surrounding the core.

3. A method of making a thin film transistor, comprising:
    forming each of a plurality of coaxial silicon nanowires, including forming a core and forming an insulating layer surrounding the core;
    disposing a multi-coaxial silicon nanowire unit including the plurality of coaxial silicon nanowires on a substrate, the multi-coaxial silicon nanowire unit including a central portion and end portions of the central portion;
    forming a fixing layer on the central portion of the multi-coaxial silicon nanowire unit and on the substrate;
    forming a gate electrode on the fixing layer;
    forming a first source electrode and a first drain electrode on the respective end portions so as to electrically connect to the multi-coaxial silicon nanowire unit, wherein the gate electrode, the first source electrode, and the first drain electrode are simultaneously formed in the same process step; and
    forming a second source electrode connected to the first source electrode and a second drain electrode connected to the first drain electrode,
    wherein forming the core comprises crystallizing a semiconductor material, and forming the insulating layer surrounding the core comprises crystallizing one of silica and alumina.

4. The method according to claim 2, further comprising removing a portion of the insulating layer at the ends of the multi-coaxial silicon nanowire unit so as to connect the core with the first source and drain electrodes.

5. A method of making an array substrate including a thin film transistor, comprising:
    disposing a multi-coaxial nanowire unit including a plurality of coaxial nanowires on a substrate;
    forming a fixing layer on a central portion of the multi-coaxial nanowire unit and on the substrate;
    forming a gate electrode on the fixing layer;
    forming a first source electrode and a first drain electrode so as to electrically connect to the multi-coaxial nanowire unit, wherein the gate electrode, the first source electrode, and the first drain electrode are simultaneously formed in the same process step;
    forming a second source electrode connected to and overlapping the first source electrode and a second drain electrode connected to and overlapping the first drain electrode; and
    forming a pixel electrode connected to the second drain electrode.

* * * * *